United States Patent
Frank et al.

(10) Patent No.: US 7,272,806 B2
(45) Date of Patent: Sep. 18, 2007

(54) SYSTEM AND METHOD FOR EVALUATING POWER AND GROUND VIAS IN A PACKAGE DESIGN

(75) Inventors: Mark D. Frank, Longmont, CO (US); Jerimy Nelson, Fort Collins, CO (US); Nathan Bertrand, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 761 days.

(21) Appl. No.: 10/368,789

(22) Filed: Feb. 19, 2003

(65) Prior Publication Data

US 2004/0162715 A1 Aug. 19, 2004

(51) Int. Cl.
*G06F 17/50* (2006.01)
(52) U.S. Cl. ............................................ 716/5; 716/10
(58) Field of Classification Search ............... 716/5, 716/8–14; 174/263; 257/737, 738; 438/14
See application file for complete search history.

(56) References Cited

U.S. PATENT DOCUMENTS

| | | | |
|---|---|---|---|
| 6,026,224 A * | 2/2000 | Darden et al. ................ 716/10 |
| 6,417,463 B1 * | 7/2002 | Cornelius et al. ........... 174/263 |
| 6,613,592 B1 * | 9/2003 | Chen et al. ................... 438/14 |
| 6,615,400 B1 * | 9/2003 | Lukanc ......................... 716/11 |
| 6,727,169 B1 * | 4/2004 | Raaijmakers et al. ....... 438/622 |
| 6,829,754 B1 * | 12/2004 | Yu et al. ......................... 716/5 |
| 2003/0051218 A1 * | 3/2003 | Kumagai ........................ 716/8 |
| 2004/0063228 A1 * | 4/2004 | Li et al. ........................ 438/14 |

* cited by examiner

*Primary Examiner*—Vuthe Siek

(57) ABSTRACT

A method and software product evaluate vias in an electronic design. One or more via sufficiency rules are formulated, and then the electronic design is processed to determine whether the vias of the electronic design violate the via sufficiency rules. In the event of a violation, one or more indicators are generated to identify vias that violate the via sufficiency rules. The indicators are visual indicators (e.g., via insufficiency DRCs) on a graphical user interface, and/or a textual report summarizing violations.

13 Claims, 9 Drawing Sheets

SYSTEM AND METHOD FOR EVALUATING POWER AND GROUND VIAS IN A PACKAGE DESIGN

RELATED APPLICATIONS

This application is related to the following commonly owned and co-filed U.S. Patent applications, each of which is incorporated herein by reference: U.S. patent application Ser. No.: 10/368,988, filed Feb. 19, 2003, titled "System And Method For Evaluating Vias Per Pad In A Package Design"; U.S. patent application Ser. No.: 10/368,837, filed Feb. 19, 2003, titled "System And Method For Evaluating Signal Coupling Between Differential Traces In A Package Design"; U.S. patent application Ser. No.: 10/368,776, filed Feb. 19, 2003, titled "System And Method For Evaluating Signal Coupling Between Vias In A Package Design"; U.S. patent application Ser. No.: 10/368,758, filed Feb. 19, 2003, titled "System And Method For Evaluating Signal Deviations In A Package Design"; and U.S. patent application Ser. No.: 10/368,778, filed Feb. 19, 2003, titled "System And Method For Evaluating Signal Trace Discontinuities In A Package Design".

BACKGROUND

Prior art computer aided design (CAD) software is known to include complementary tool suites for designing and analyzing the package of a die, e.g., a microprocessor. A "package" is the physical interconnection between the die and, for example, a printed circuit board (PCB). A typical package has several interconnected layers between its top level (L1), which connects to the die, and its bottom level (L2), which connects to the PCB.

A package "design" is a hierarchical and symbolic digital model of the package circuit. Those skilled in the art appreciate that hardware description languages (HDLs) may be used to formulate this digital model. The digital model consists of linked design elements that simulate the package circuit. The design elements are for example digital representations of the transistors, resistors, logic gates, traces (i.e., intra-layer conductors), capacitors, vias (i.e., inter-layer connectors), and wire bonds that make up the simulated schematic circuit.

The design elements and interconnections are collated and defined in a design database, which is a textual representation of the package design. The design database may further describe the package design in terms of higher-level cells consisting of two or more design elements, and the connections between cells. Each "net" in the package design describes the linked conductors (e.g., traces of a layer and vias between layers) that form a circuit between an input and an output of the package. The CAD software may automatically route traces within a given layer of the package design; it may further automatically route vias between layers of the package design.

The design database is processed by the CAD software to perform circuit simulation. The CAD software is for example used to model a signal through the package and over a net (i.e., a "signal net"). Substrate laminate technologies and bond interconnections may also be evaluated through the CAD software.

One exemplary prior art CAD software is Advanced Package Designer (APD) from Cadence Design Systems, Inc., of San Jose, Calif. Such CAD software is known to include verification procedures and dynamic feedback that evaluate design accuracy against a set of physical and electrical design rules, or constraints. Physical design constraints help to ensure manufacturability; electrical design constraints help to ensure electrical specifications of the design. By way of example, this CAD software generates a Design Rule Check (DRC) indicating whether the design meets the various constraints. The prior art CAD software also provides a graphical user interface to view all or part of the package design in two dimensions, for example in a flat or perspective rendition, or with layers overlaid relative to one another.

FIG. 1 illustrates one prior art system 10 for designing a package with prior art CAD software 12. CAD software 12 is stored within a computer 14, initially within a storage unit 16. A processor 18 of computer 14 operates CAD software 12 in response to user inputs at an input interface 20 (e.g., a computer keyboard and mouse). As those skilled in the art appreciate, when initialized, CAD software 12 may also load into internal memory 22 of computer 14. A human designer at input interface 20 then controls CAD software 12, through processor 18, to create a package design 24, also stored within memory 22. The designer can command processor 18 and CAD software 12 to graphically show package design 24 at a graphical user interface 26 (e.g., a computer monitor) of system 10. Illustratively, package design 24 is graphically depicted on a display 28 of graphical user interface 26 as a five-layer graphical model 24A shown in FIG. 2.

FIG. 2 illustrates detail of graphical model 24A. L1 of model 24A couples with a die, and L2 of model 24A couples with a PCB. Layers I(1), I(2) and (3) of model 24A represent intermediate layers of package design 24. Layers L1, I(1), I(2), I(3), L2 are shown as distinct elements and with not-to-scale orientations for ease of illustration. An illustrative signal net 30 is shown from an input connector 32 to an output connector 34 of model 24A. Signal net 30 traverses design elements in the form of traces and vias between connectors 32, 34: via 35 from connector 32 of L1 to trace 36 of I(1); trace 36 within I(1) from via 35 to via 38; via 38 from trace 36 of I(1) to trace 40 of I(2); trace 40 within I(2) from via 38 to via 42; via 42 from trace 40 of I(2) to trace 44 of I(3); trace 44 within I(3) from via 42 to via 46, which terminates at connector 34 of L2.

Design 24 also has power vias 60 and ground vias 70. As known to those skilled in the art, power vias 60 are designed to provide power to levels L1, I(1)-I(3), L2 of design 24, for use by design elements and signals of these respective layers. Ground vias 70 similarly provide grounding to layers L1, I(1)-I(3), L2 of design 24, for use by design elements and signals of these respective layers. Those skilled in the art appreciate that a typical design 24 can and usually does have many more power and ground vias 60, 70 than what is shown in FIG. 2; though only a few power and ground vias 60, 70 are shown for purposes of illustration.

With further regard to FIG. 1, CAD software 12 is also operable to generate a design database 50. In one example, design database 50 textually defines signal net 30 of FIG. 2: signal net 30 is defined by connectors 32, 24, traces 36, 40, 44, and vias 35, 38, 42, 46. Design database 50 also defines power and ground vias 60, 70. Design database 50 further includes parameters (often called a "netlist") to ensure that signal net 30 has start and end points (i.e., connectors 32, 34 for signal net 30). The netlist also typically defines physical size dimensions of package design 24. A designer can manipulate design database 50 to develop the desired package design 24.

CAD software 12 utilizes design rules 52 to generate one or more DRCs 54 in the event that a design element or signal net of package design 24 exceeds a manufacturing constraint or electrical specification. By way of example, design rules 52 may specify that a trace width of trace 36 is 20 μm, to ensure manufacturability. If a designer of system 10 implements trace 36 with 10 μm, for example, then CAD software 12 generates a DRC 54A, which may be graphically displayed on model 24A, as shown in FIG. 2. The user is thus made aware that a problem may exist with trace 36.

Those skilled in the art appreciate that package design 24 often has more than the five layers illustrated in model 24A; however only five layers are shown in FIG. 2 for ease of illustration. For example, it is common that package design 24 include ground layers between each layer with signal traces (I(1), I(2) and I(3); however these ground layers are not shown to simplify illustration. Those skilled in the art also appreciate that package design 24 also typically has many more signal nets and other design elements than illustrated signal net 30.

FIG. 3 illustrates package model 24A in a side view. FIG. 3 further illustrates how package design 24 connects between a die 80 and a PCB 82. Connector 32 is for example a pad that connects with a solder ball 84 of die 80; connector 34 is for example a pad that connects with signal wires of PCB 82.

The increased complexity of the modem die has correspondingly increased the complexity of the package design. An example of a complex die includes a Precision Architecture-Reduced Instruction Set Computer (PA-RISC) processor produced by Hewlett Packard Corporation, which has over one billion components. The package for the PA-RISC processor must maintain high signal integrity through its signal nets; however the prior art CAD software does not simulate this signal integrity as required by the corresponding die. Accordingly, the package may be physically manufactured, at great expense, before the designer learns that the package is not suitable for operation with the die. By way of example, while the DRCs generated by the prior art CAD software may assist in manufacturability; they do not warn the designer of power and ground incompatibilities affecting the signal nets between the die and the package. Specifically, prior art CAD software 12 does not evaluate the number and sufficiency of power and ground vias 60, 70, respectively, of package model 24A; an appropriate number of these power and ground vias 60, 70 must nonetheless be available to support the layers of design 24 in providing proper signal integrity, voltage changes, and inductances.

SUMMARY OF THE INVENTION

In one aspect, a method evaluates vias in an electronic design. The method includes the step of formulating one or more via sufficiency rules, and then processing the electronic design to determine whether the vias of the electronic design violate the via sufficiency rules. In the event of a violation, the method further includes generating an indicator associated with the electronic design to identify vias that violate the via sufficiency rules. The step of generating an indicator can include generating a visual indicator (e.g., a via insufficiency DRC) on a graphical user interface depicting the electronic design, and/or a textual report summarizing the violations.

In another aspect, the step of processing includes the step of processing one or more selected layers of the electronic design for violation of the via sufficiency rules.

By way of example, one via sufficiency rule may define a via per pad count (e.g., an integer such as three) for one layer (e.g., L2) of the electronic design. In one aspect, therefore, the step of processing includes the step of counting vias coupled with each pad of the one layer and at one or more layers of the electronic design. When an insufficient number of vias couple with at least one pad of the one layer, a via insufficiency DRC may be generated. The indicator of one aspect graphically depicts the DRC on a graphical user interface illustrating the electronic design. The indicator of another aspect textually defines the DRC in a report.

In one aspect, the vias are either ground vias or power vias.

Another via sufficiency rule may specify that each layer of the electronic design should have a like number of vias. In one aspect, therefore, step of processing includes the step of determining whether each layer has the like number of vias. In the event that one or more layers do not have the like number of vias, as compared to the other layers of the electronic design, then one or more via insufficiency DRCs may issue as the indicator. These DRCs may be graphical indicators and/or listed in a textual summary reporting the violations.

In one aspect, a software product is provided. The software product has instructions, stored on computer-readable media, wherein the instructions, when executed by a computer, perform steps for determining via sufficiency in an electronic design. In one aspect, these steps include: determining instances of vias within the electronic design; comparing the instances to one or more via sufficiency rules; and generating an indicator associated with the electronic design to identify violations of the via sufficiency rules.

In another aspect, the software product further provides for formulating one or more of the via sufficiency rules.

By way of example, if one of the via sufficiency rules defines that each layer of the electronic design should have a like number of vias, the software product is operable to determine whether each layer of the electronic design has the like number of vias. In another example, if one of the via sufficiency rules defines a via count per pad for one layer (e.g., L2) of the electronic design, the software product is operable to determine whether each layer of the electronic design has a requisite number of vias associated with each pad of the one layer.

Various ones of the methods, systems and products herein may provide certain advantages. In one example, a computer system configured with the via sufficiency evaluation software can count ground and/or power vias, per layer, in a package design to match package performance to its pad count. More particularly, since a via can only handle a certain amount of current, the system of one aspect ensures that these via current limits are not exceeded, throughout the package design, by notifying the designer whether a minimum number of vias exists, per pad (ground and/or power pad), and/or whether the number of power and ground vias is uniform for each layer. This minimum number helps to ensure that sufficient vias exist to meet the voltage drop and inductance requirements of the package. In one exemplary aspect, the system ensures that the number of ground and/or power vias remains substantially the same for each layer in the package design. In one embodiment, the number of vias desired throughout the package design is a multiple of the L2 pad count. If for example there are thirty-five ground pads in L2, then it is desirable to have three ground vias per pad, or 105 ground vias per layer. If for example there are thirty-five power pads in L2, then it is also desirable to have at least three power vias per power pad, or 105 power vias per layer.

DETAILED DESCRIPTION OF THE DRAWINGS

Figure 1:
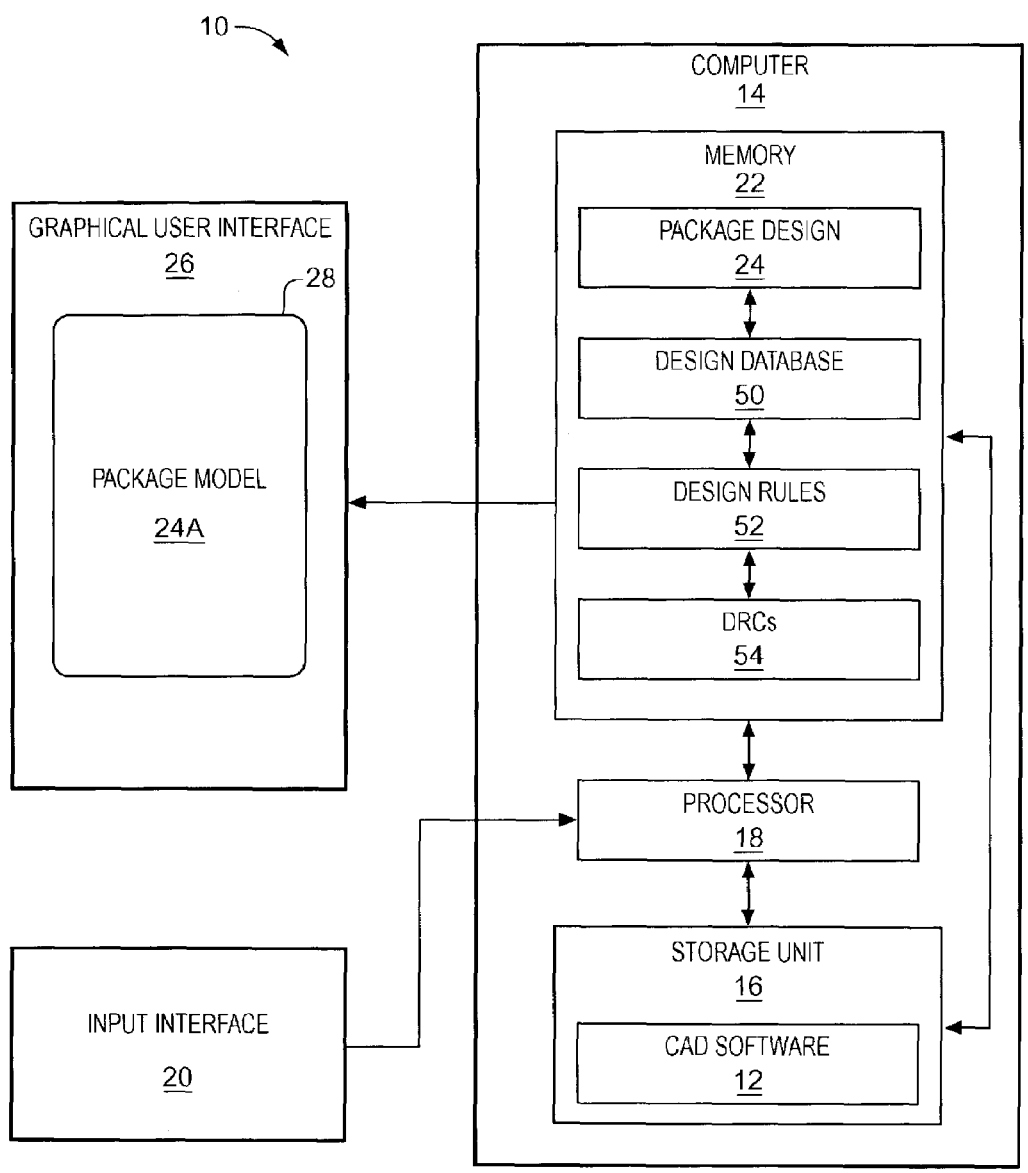
FIG. 1 shows a prior art system and CAD software for designing a package.
Figure 2:
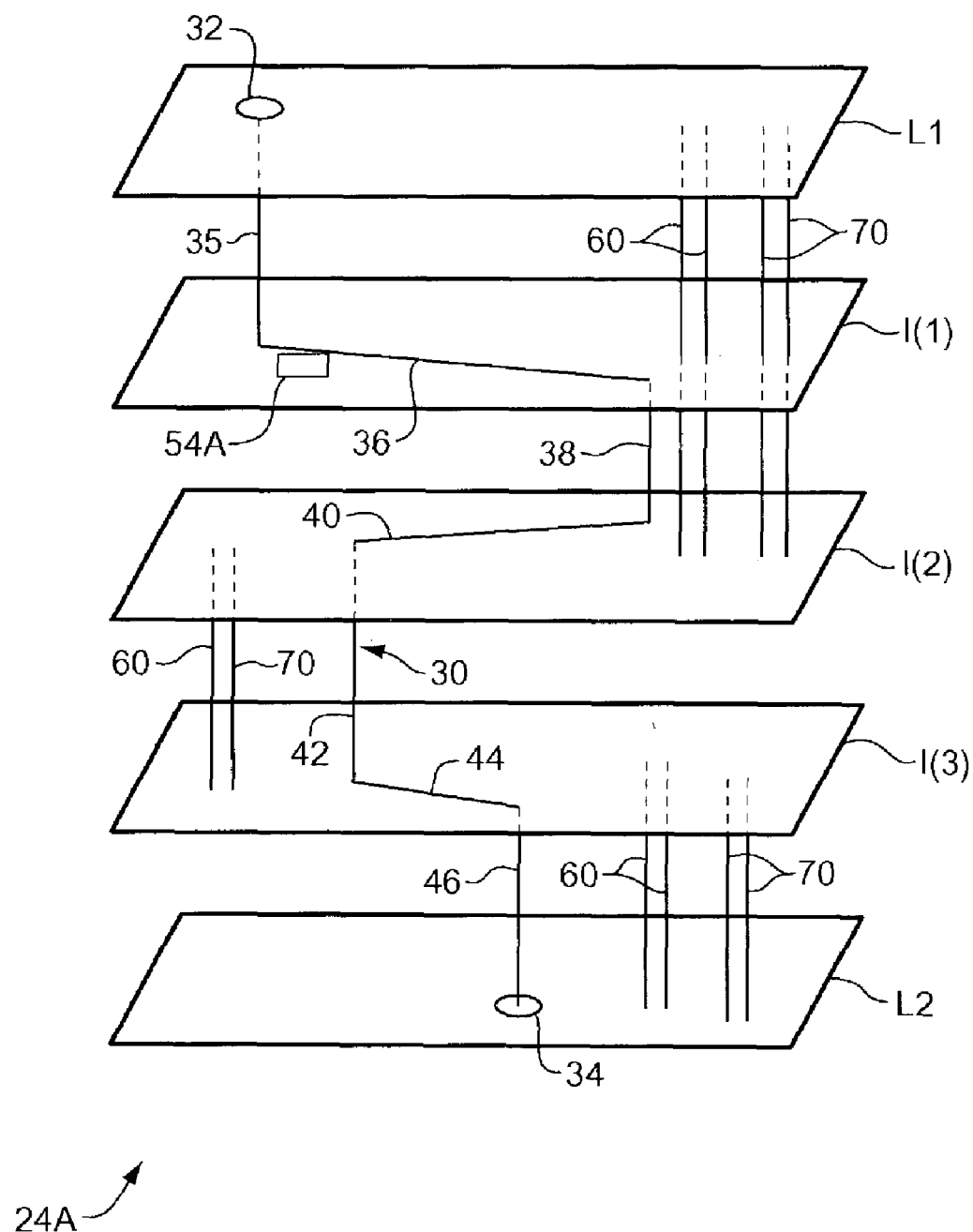
FIG. 2 shows, in a perspective view, one illustrative graphical model of the package design of FIG. 1.
Figure 3:
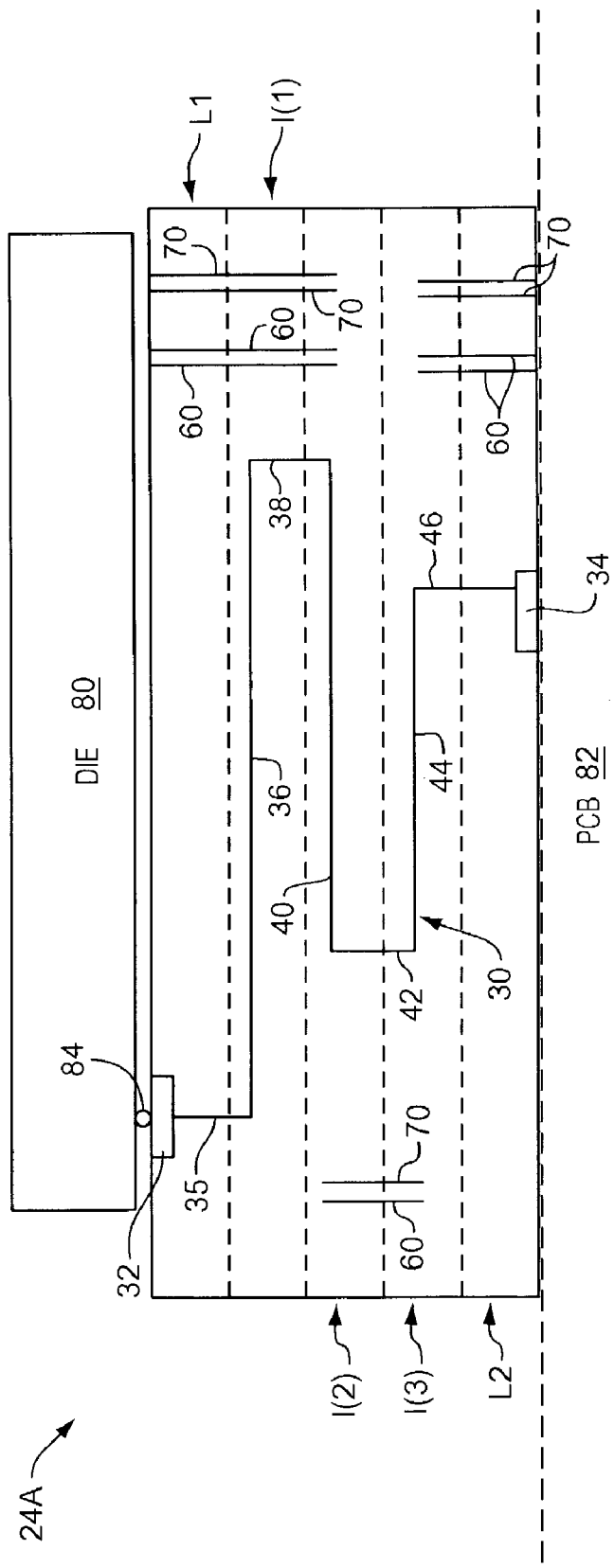
FIG. 3 illustrates the package design of FIG. 1 in a side view.
Figure 4:
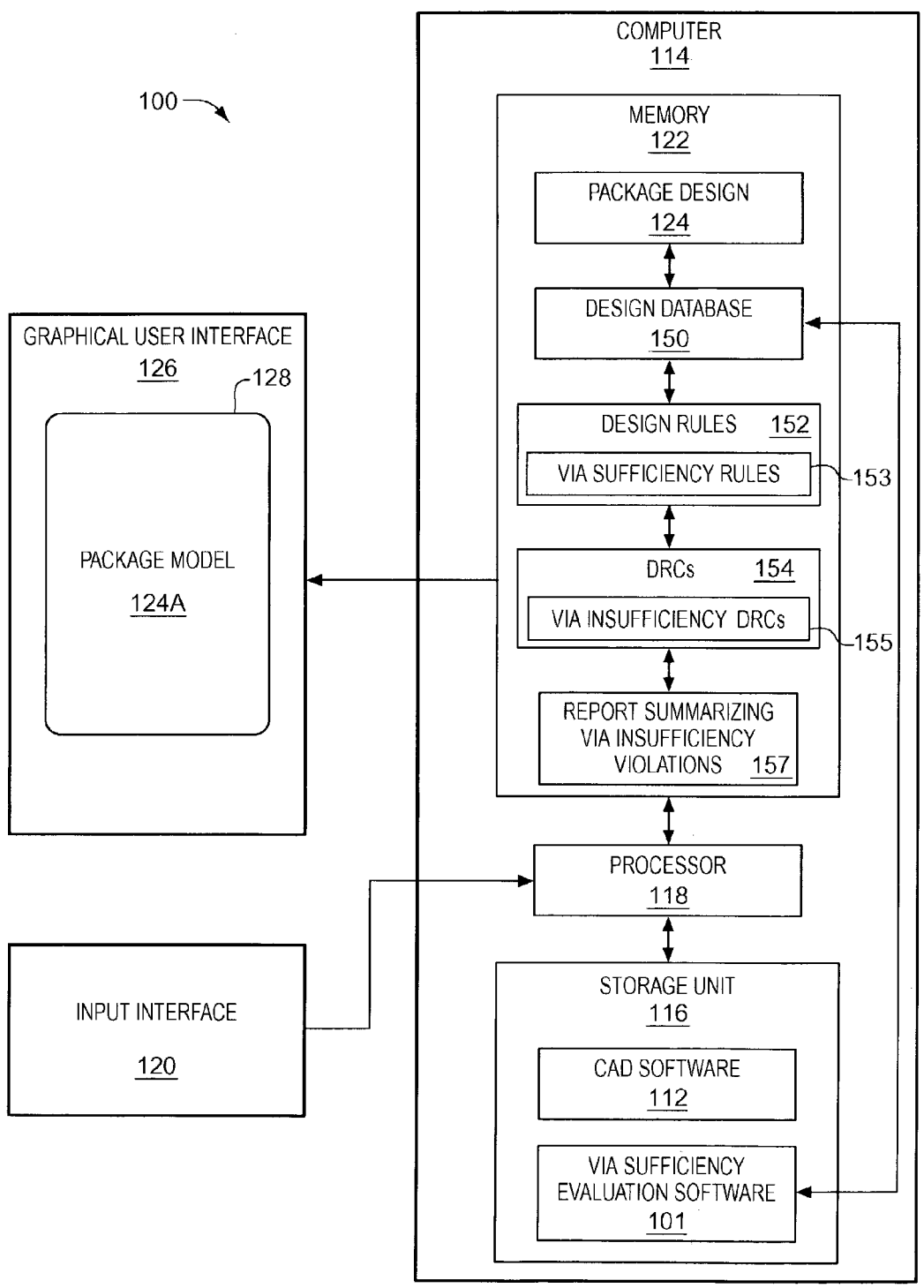
FIG. 4 shows one system for evaluating power and ground vias in a package design.
Figure 5:
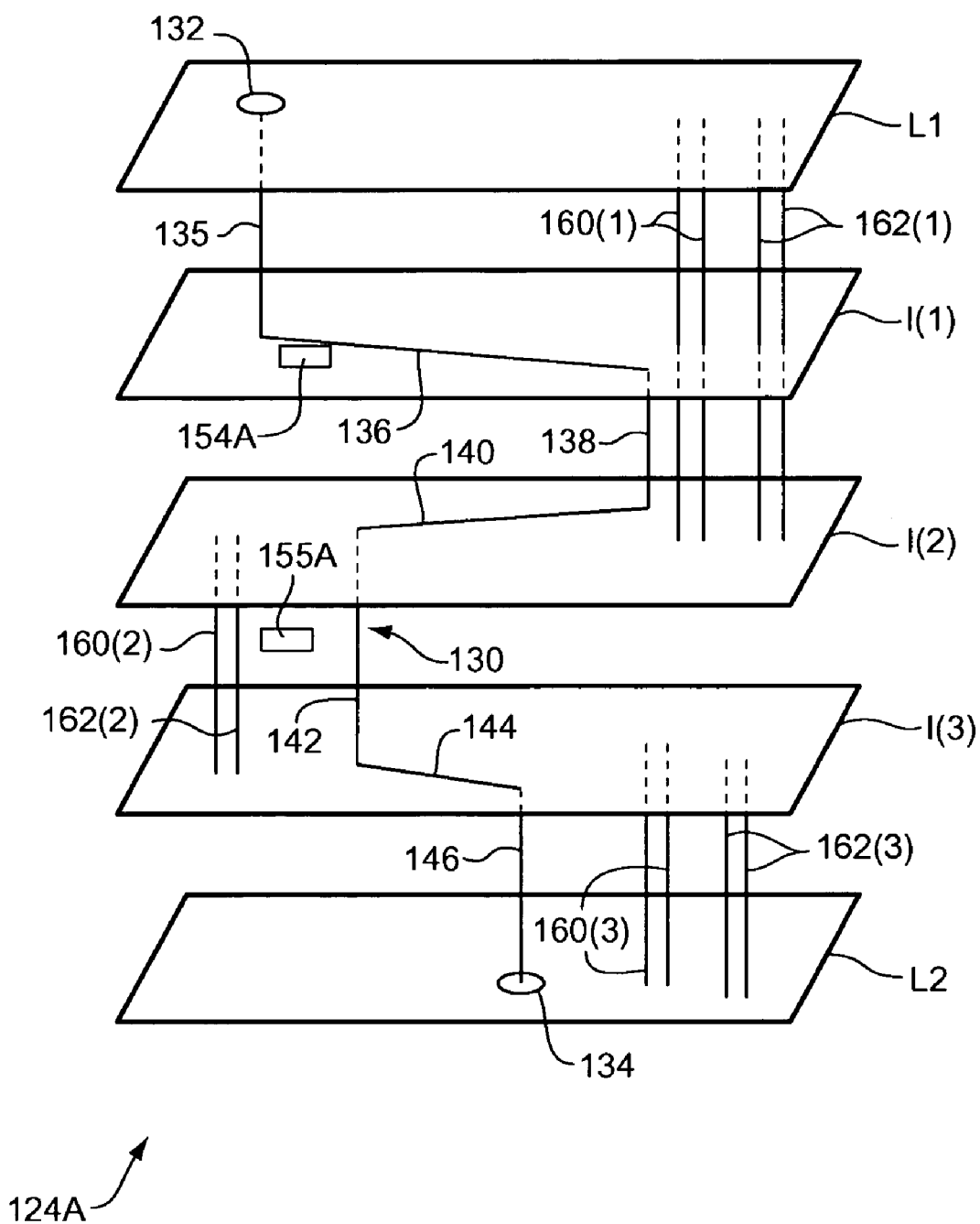
FIG. 5 illustrates one package design processed by the system of FIG. 4.

FIG. 4 shows one system 100 for designing and evaluating a package design utilizing CAD software 112 and via sufficiency evaluation software 101. CAD software 112 and via sufficiency evaluation software 101 are stored within a computer 114, initially within a storage unit 116. A processor 118 of computer 114 operates CAD software 112 and via sufficiency evaluation software in response to user inputs at an input interface 120 (e.g., a computer keyboard and mouse). When initialized, CAD software 112 and via sufficiency evaluation software 101 may load into internal memory 122 of computer 114 as sets of instructions. A human designer at input interface 120 may then control CAD software 112 and via sufficiency evaluation software 101, through processor 118, to create a package design 124, also stored within memory 122. The designer can command processor 118 and CAD software 112 to graphically show package design 124 in one or more dimensions at a graphical user interface 126 (e.g., a computer monitor) of system 100. Illustratively, package design 124 is graphically depicted on a display 128 of graphical user interface 126 as a five-layer package model 124A, shown and described in connection with FIG. 5. In FIG. 5, L1 of model 124A couples with a die, and L2 of model 124A couples with a PCB. Layers I(1), I(2) and (3) of model 124A represent intermediate layers of package design 124. Layers L1, I(1), I(2), I(3), L2 are shown as distinct elements and with not-to-scale orientations for ease of illustration.

An illustrative signal net 130 is shown in FIG. 5 from an input connector 132 to an output connector 134 of model 124A. Signal net 130 traverses design elements in the form of traces and vias between connectors 132, 134: via 135 from connector 132 of L1 to trace 136 of I(1); trace 136 within I(1) from via 135 to via 138; via 138 from trace 136 of I(1) to trace 140 of I(2); trace 140 within I(2) from via 138 to via 142; via 142 from trace 140 of I(2) to trace 144 of I(3); trace 144 within I(3) from via 142 to via 146, which terminates at connector 134 of L2. Layers L1, I(1)-I(3), L2 receive power and ground from, respectively, power and ground vias 160, 162, to support the signal nets (e.g., signal net 130) traversing layers L1, I(1)-I(3), L2 and the design elements disposed with each layer.

CAD software 112 is operable to generate a design database 150. In one example, design database 150 textually defines signal net 130, including connectors 132, 134, traces 136, 140, 144, and vias 135, 138, 142, 146. Design database 150 also textually defines power and ground vias 160 and 162, respectively.

Via sufficiency evaluation software 101 is operable to process design database 150 to locate and evaluate vias within package design 124. Design database 150 includes parameters (e.g., a netlist) to set physical parameters of package design 124 that ensure, for example, signal net 130 has appropriate start and end points (i.e., that signal net 130 has start and end points 132, 134, respectively). A designer can manipulate design database 150 to develop the desired package design 124. As a matter of design choice, via sufficiency evaluation software 110 may be combined with CAD software 112.

CAD software 112 processes design database 150 and utilizes design rules 152 to generate one or more Design Rule Checks (DRCs) 154 in the event that a design element or signal net of package design 124 exceeds a manufacturing constraint or electrical specification. One DRC 154A is illustratively shown in model 124A, for example illustrating non-manufacturability of trace 136. A DRC 154 may also be a textual indicator, for example a statement written to a report 157, described below. Illustratively, such a textual DRC 154 may for example state: DRC 154A=trace 136 violates physical constraint of 20 μm.

Figure 8A:
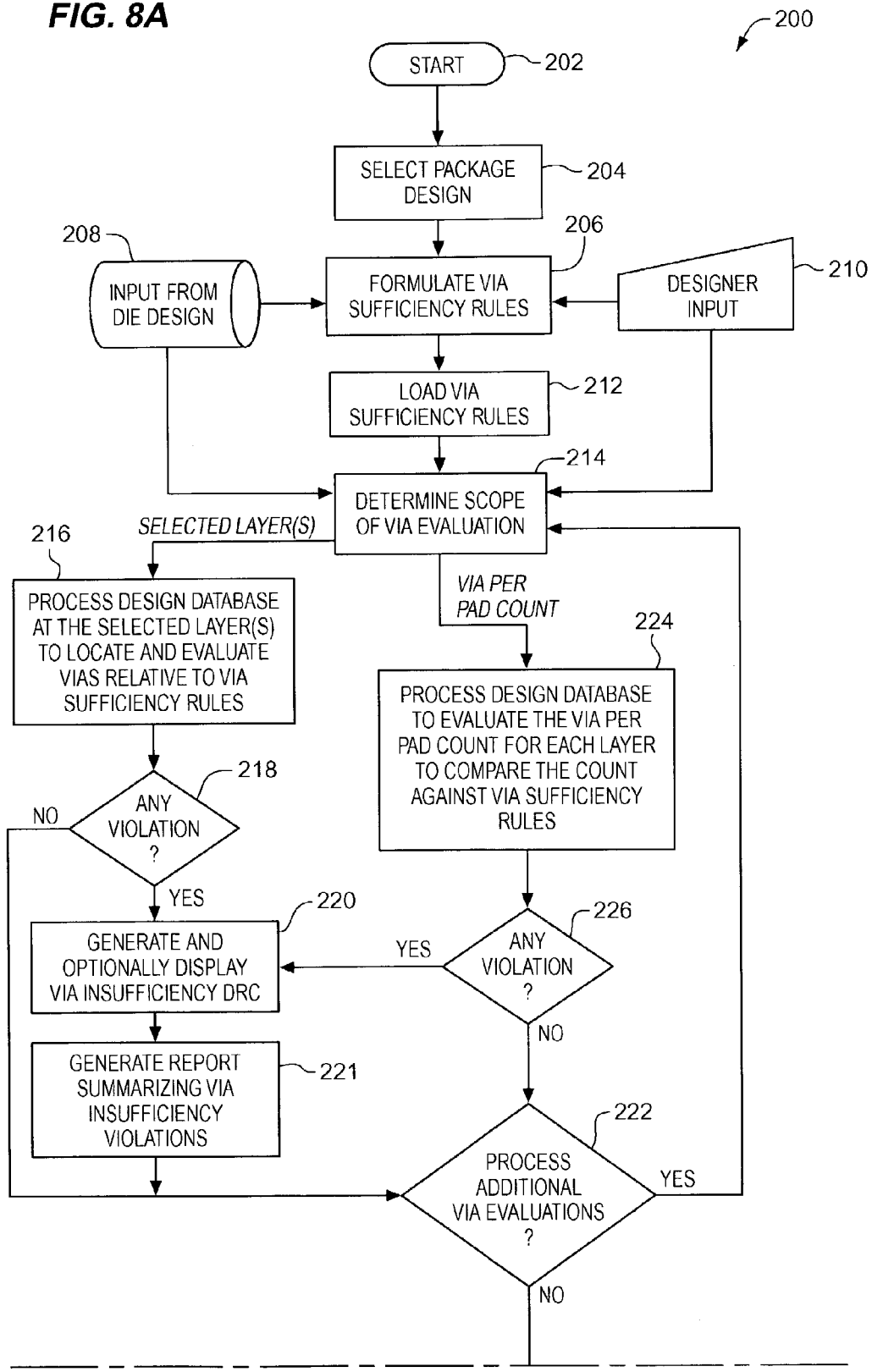
FIG. 8A and FIG. 8B show a flowchart illustrating one method for processing a package design to evaluate power and ground vias.
Figure 8B:
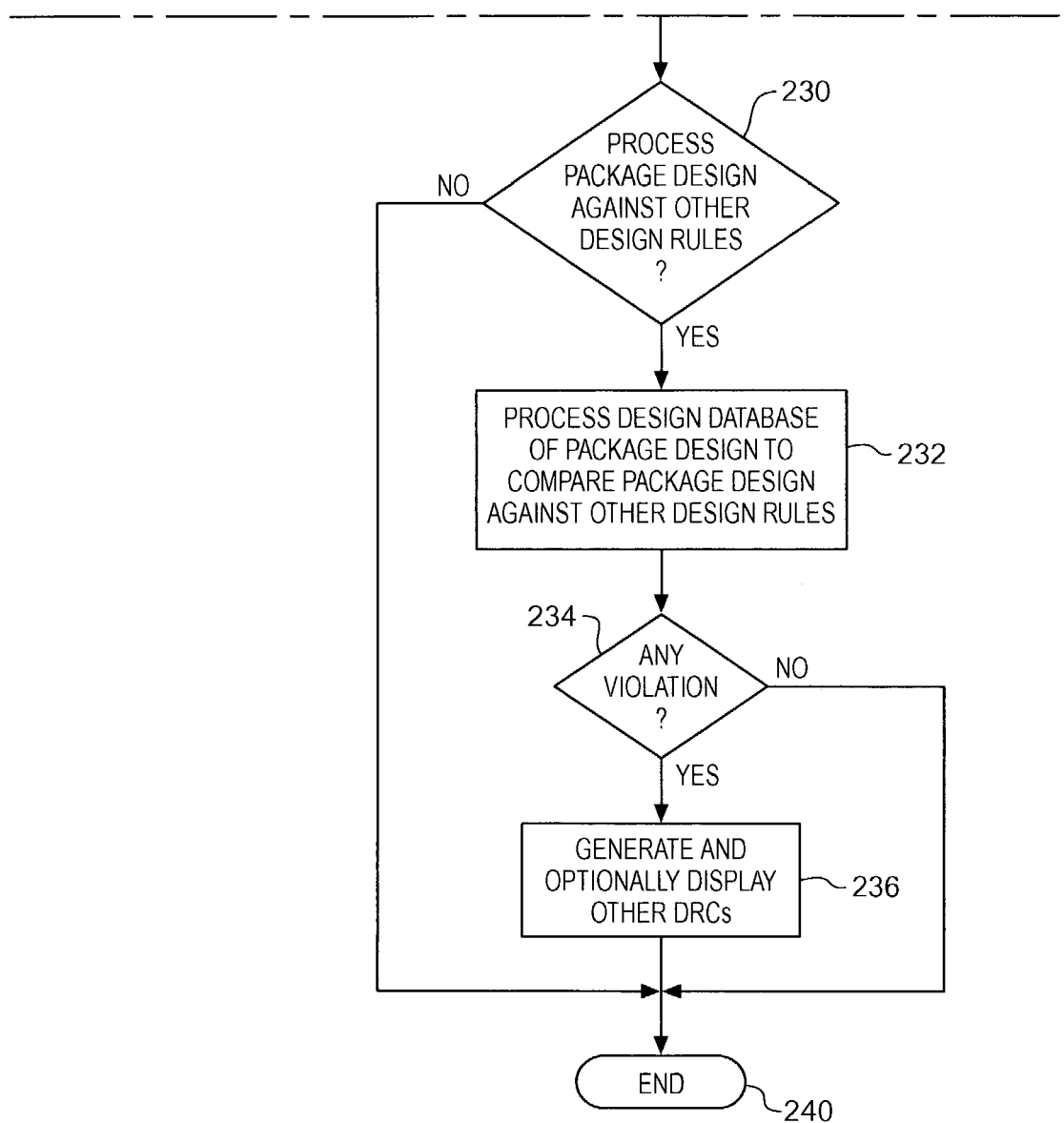

Via sufficiency evaluation software 101 processes design database 150 and utilizes via sufficiency rules 153 to generate one or more via insufficiency Design Rule Checks (DRCs) 155. One DRC 155A is illustratively shown in FIG. 5, indicating a violation of via sufficiency rules 153. DRC 155A for example illustrates that power via 160(2) and/or ground via 162(2) is not sufficient according to via sufficiency rules 153. All violations of via sufficiency rules 153 may be summarized in a report 157 managed by via sufficiency evaluation software 101. FIG. 8A and FIG. 8B describe the operation of system 100 in its generation and utilization of via sufficiency rules 153 and DRCs 155.

Illustratively, a representative via sufficiency rule may be stated textually as follows: each layer should have the same number of power vias 160 and the same number of ground vias 162. This illustrative rule ensures that each layer has sufficient power and ground to handle voltage drops and inductance goals of package design 124. Another illustrative rule may be: each L2 pad has X vias (ground and/or signal vias) per pad, where X is an integer number such as three. A DRC 155 may also be a textual indicator, for example a statement written to report 157. Illustratively, such a textual DRC 155 may for example state: DRC 155A=there is an insufficient number of power and ground vias 160(2), 162 (2), respectively, between layers I(2) and I(3).

Figure 6:
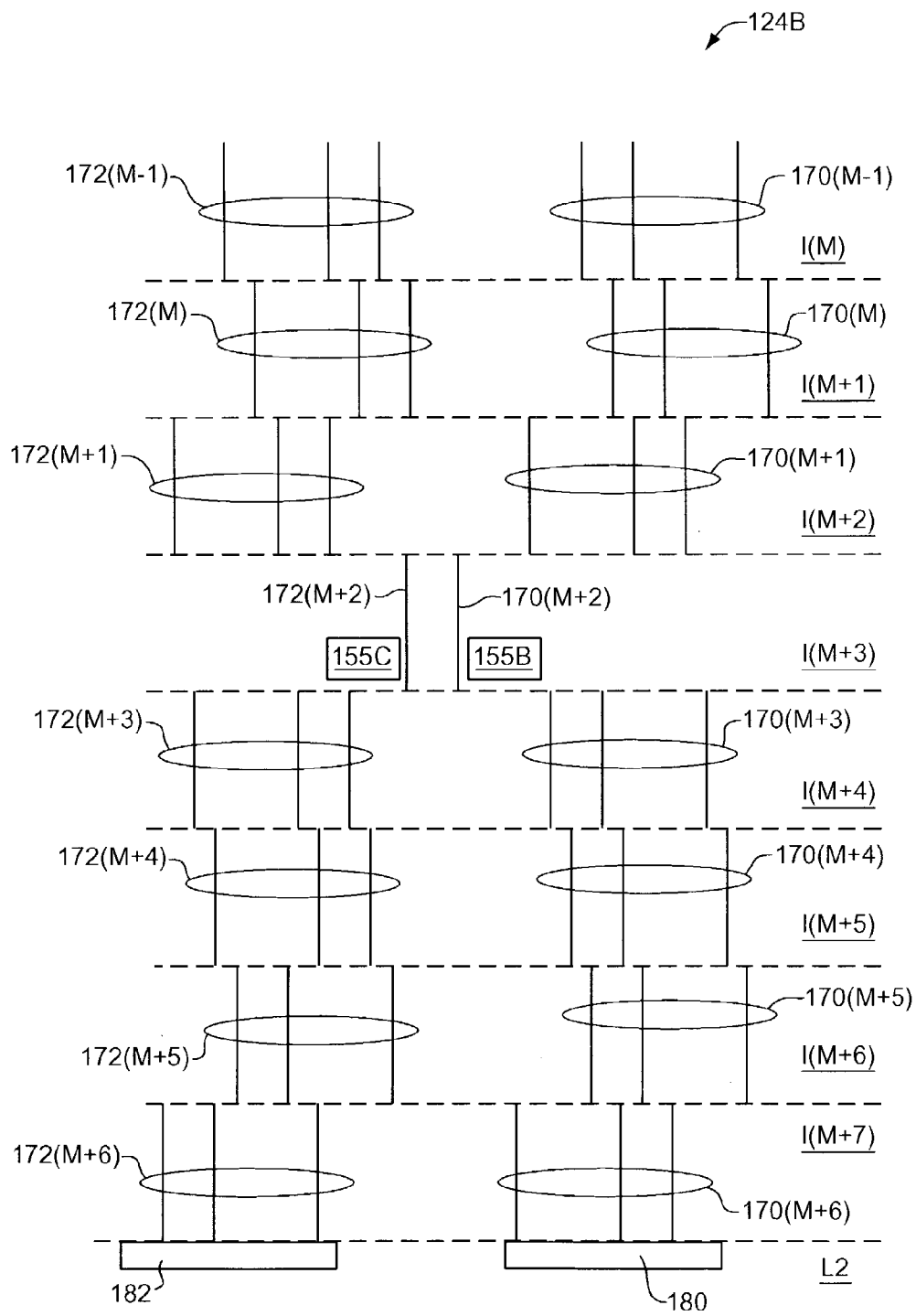
FIG. 6 illustrates one other package design processed by the system of FIG. 4.

FIG. 6 schematically illustrates a package design 124B showing L2 and multiple intermediate layers I(M)-I(M+7). A plurality of power vias 170 couple between the several layers I(M)-I(M+7) and L2, to provide power thereto. Package design 124B is shown without other design elements, traces, signal nets, etc., for ease of illustration. Layers I(M), I(M+2), I(M+4),I(M+6) may for example represent ground layers, while layers I(M+1), I(M+3), I(M+5), I(M+7) may represent signal layers. Power vias 170(M−1) couple between layer I(M−1) (not shown) and layer I(M); power vias 170(M) couple between layer I(M) and layer I(M+1); power vias 170(M+1) couple between layer I(M+1) and layer I(M+2); power vias 170(M+2) couple between layer I(M+2) and layer I(M+3); power vias 170(M+3) couple between layer I(M+3) and layer I(M+4); power vias 170 (M+4) couple between layer I(M+4) and layer I(M+5); power vias 170(M+5) couple between layer I(M+5) and layer I(M+6); and power vias 170(M+6) couple between layer I(M+6) and layer I(M+7). As shown, all intermediate layers except I(M+2), I(M+3) and I(M+4) have a like number of power vias 170; layers I(M+2), I(M+3), I(M+4) have fewer power vias 170 because only one power via 170(M+2) couples between layers I(M+2) and I(M+3). As described in more detail below, via sufficiency evaluation software 101, FIG. 4, is operable to determine whether power vias 170 meet designer guidelines set forth in via sufficiency rules 153. If power vias 170 do not comply with the set of via sufficiency rules 153, a via insufficiency DRC 155B may be created to warn the designer of the offending vias 170(M+2), such as illustrated in FIG. 6.

A plurality of ground vias 172 couple between the several layers I(M)-I(M+7) and L2, to provide ground thereto. Ground vias 172(M-1) couple between layer I(M-1) (not shown) and layer I(M); ground vias 172(M) couple between layer I(M) and layer I(M+1); ground vias 172(M+1) couple between layer I(M+1) and layer I(M+2); ground vias 172 (M+2) couple between layer I(M+2) and layer I(M+3); ground vias 172(M+3) couple between layer I(M+3) and layer I(M+4); ground vias 172(M+4) couple between layer I(M+4) and layer I(M+5); ground vias 172(M+5) couple between layer I(M+5) and layer I(M+6); and ground vias 172(M+6) couple between layer I(M+6) and layer I(M+7). Each intermediate layer except I(M+2), I(M+3) and I(M+4) have a like number of ground vias 172; layers I(M+2), I(M+3), I(M+4) have fewer ground vias because only one ground via 172(M+2) couples between layer I(M+2) and layer I(M+3). As described in more detail below, via sufficiency evaluation software 101, FIG. 4, is operable to determine whether ground vias 172 meet designer guidelines set forth in via sufficiency rules 153. If ground vias 172 do not comply with the set of via sufficiency rules 153, a via insufficiency DRC 155C may be created to warn the designer of the offending vias 172(M+2), such as illustrated in FIG. 6.

FIG. 6 also illustratively shows two pads 180, 182 with L2 used to couple design 124B to a PCB. Pad 180 is a power pad; pad 182 is a ground pad. Vias 170 carry power through design 124 in association with pad 180. Vias 172 carry a common ground in association with pad 182. The via per pad count for both pads 180 and 182 is therefore three, as shown. In one embodiment, system 100 of FIG. 4 generates any number of via insufficiency DRCs 155 when vias 170 and/or 172 violate via sufficiency rules 153. In a first example, a via sufficiency rule 153 specifies that the power via per pad count shall be "X" (X being an integer greater than or equal to one) and consistent throughout the package design. When X is three, package design 124B violates the first exemplary via sufficiency rule 153 at layer I(M+3). System 100 may then report and/or display DRC 155B to indicate the violation. In a second example, a via sufficiency rule 153 specifies that the ground per pad count shall by "Y" (Y being an integer greater than or equal to one) and consistent throughout the package design. When Y is three, package design 124B violates the second exemplary via sufficiency rule at layer I(M+3). System 100 may then report and/or display DRC 155C to indicate the violation.

In one embodiment, via sufficiency evaluation software 101 operates on one or a plurality of layers I(M)-I(M+7) and L2, as described in FIG. 8A and FIG. 8B. Software 101 may further operate on the entire package design, for example to evaluate the via per pad count for ground and/or power delivery through the design. Software 101 may further count any and all vias at any layer of the package design.

Figure 7:
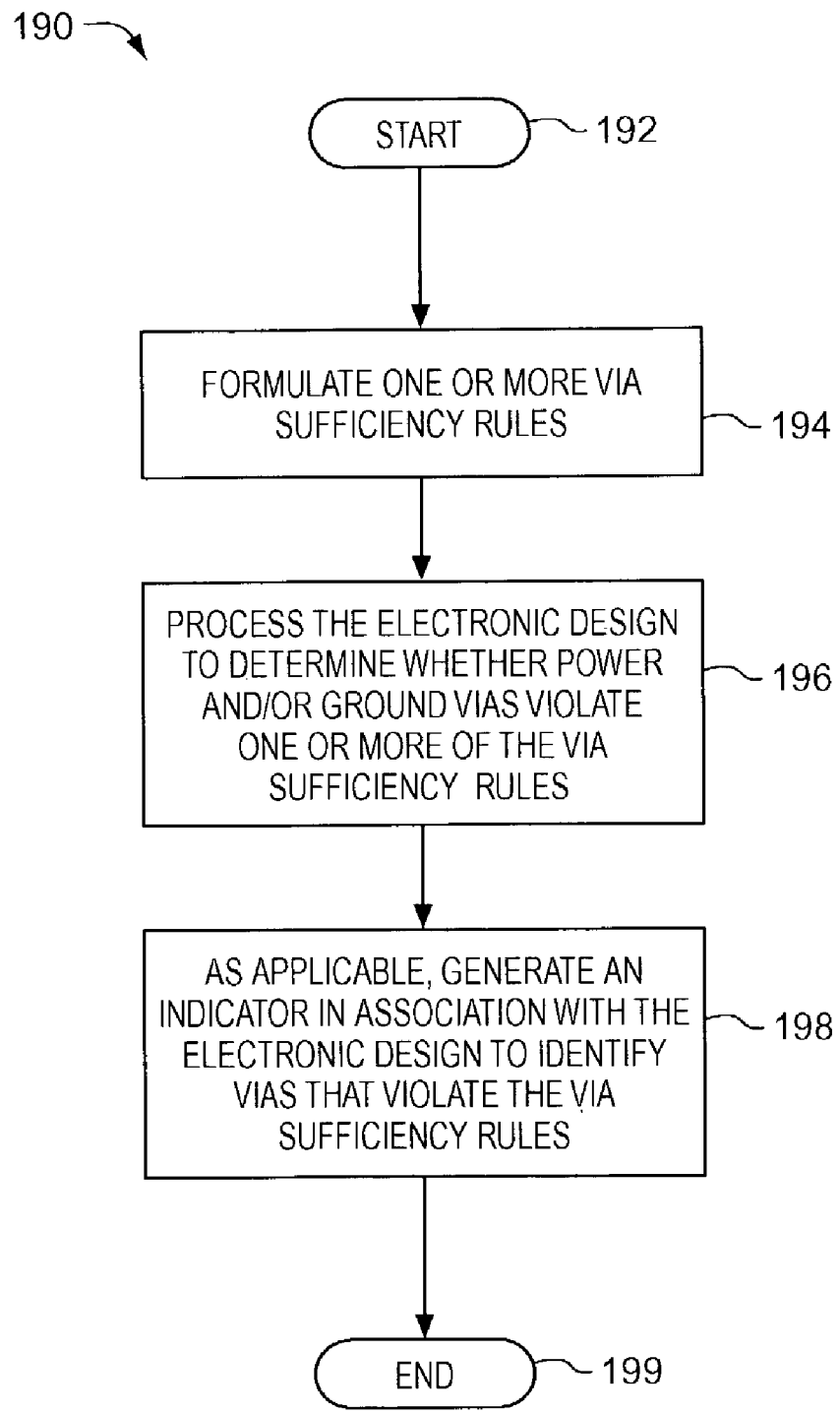
FIG. 7 is a flowchart illustrating one process for evaluating power and/or ground vias in an electronic design.

FIG. 7 is a flowchart illustrating one process 190 for evaluating evaluating vias in an electronic design. After start 192, one or more via sufficiency rules are formulated, in step 194. In step 196, the electronic design is processed to determine whether the vias of the electronic design violate one or more of the via sufficiency rules. In step 198, an indicator (e.g., a via insufficiency DRC) is generated in association with the electronic design identify vias that violate the via sufficiency rules, if any. Process 190 terminates at 199.

FIG. 8A and FIG. 8B show a flowchart illustrating one process 200 for generating and utilizing via sufficiency rules (e.g., rules 153) and via insufficiency DRCs (e.g., DRCs 155) with respect to a package design (e.g., design 124). System 100 of FIG. 4 for example utilizes process 200 to generate DRC 154A and DRC 155A in FIG. 5.

After start 202, a package design is selected in step 204; by way of example, step 204 may automatically select a current package design 124 being created by CAD software 112.

At step 206, via sufficiency rules are created. Process 200 shows two exemplary techniques for creating via sufficiency rules. In one example, via sufficiency rules are formulated 206 by processing input specifications of the die which couples with the package design, as indicated by direct data input 208. In another example, a designer manually formulates 206 via sufficiency rules, as indicated by designer input 210. The formulated via sufficiency rules are loaded to computer memory (e.g., memory 122, FIG. 4) in step 212, so that the via sufficiency rules may operate with the package design selected in step 204. Via sufficiency evaluation software 101, FIG. 4, may perform or facilitate some or all of steps 206-212.

Step 214 determines the scope of subsequent via evaluations. Illustratively, this determination 214 may derive from direct data input 208 associated with die specifications, or from designer inputs 210. The outputs of step 214 associate with the scope determined in step 214.

In one example, "selected layers" of the package design are processed for validation against the via sufficiency rules. Computer 114 of system 100 responds to the request to evaluate the selected layer(s) and processes design database 150 to locate and evaluate vias relative to via sufficiency rules 153, as indicated by step 216. For example, if all layers of model 124A, FIG. 5, are selected, then all vias 160, 162 are detected and compared against via sufficiency rules 153.

Step 218 is a decision. If the detected vias violate one or more of the via sufficiency rules, one or more via insufficiency DRCs 155 are generated (and optionally displayed with model 124A, for example as DRC 155A), as indicated by step 220. Optionally, a designer may also publish a report summarizing violations of the via sufficiency rules, as in step 221. If no violation occurs, processing continues with step 222.

In another option, from step 214, a "via per pad count" evaluation of a package design is processed for validation against the via sufficiency rules. Computer 114 of system 100 responds to the request and processes design database 150 to evaluate the via per pad count for each layer, as indicated by step 224. For example, if both power and ground vias 170, 172, respectively, of model 124B, FIG. 6, are selected for the scope of the evaluation, then, in step 224, each of the vias 170, 172 are evaluated and compared against via sufficiency rules 153.

Step 226 is a decision. If one or more vias and/or layers violate one or more of the via sufficiency rules, one or more via insufficiency DRCs 155 are generated (and optionally displayed with model 124A, for example, as DRC 155A), as indicated by step 220. If no violation occurs, processing continues with step 222.

Step 222 is a decision. If additional via evaluations (with differing scope) are designated, step 214 repeats; otherwise, process 200 continues with step 230. Step 230 is a decision. If the package design is to be evaluated against other design rules (e.g., rules 154, FIG. 4), step 232 processes the design database relative to the other design rules. Step 234 is a decision. If other DRCs 154 exist due to violation of the other design rules, process 200 continues with step 236;

otherwise process 200 ends at step 240. In step 236, one or more other DRCs (e.g., DRC 154A, FIG. 4) may be generated and optionally displayed.

The following "pseudo" code illustrates one example for performing power and ground via design rule checks for a single designer-selected layer in a package design.

```
********Pseudo Code*******
Variables:
Die_Specification :           (Structure to contain specifics for die selected)
Die_Specification_File :      (Name of file containing die specifications)
Package_Design_List :         (Structure to contain a list of all design elements
                               of the package design in the design database)
Design_Element_List :         (Structure to contain a list of design elements
                               selected from the Package_Design_List)
Design_Name :                 (Variable identifying the specific design to be
                               validated)
Designer_Selected_Layer :     (Variable to store a designer-selected layer)
Design_Rule_List :            (Structure to contain a list of via sufficiency rules)
Design_Rule_Checks_List :     (Structure to contain a list of rule violations)
    {Load Specification for the die used by the package into a list variable.}
    Die_Specification := LoadDieSpecificationFromFile(Die_Specification_File);
    {Load the package design from the package design database}
    Package_Design_List := LoadPackageDesign(Design_Name);
    {Generate die specific design rules from the die specification}
    Design_Rule_List := GenerateDesignRules(Die_Specification);
    {Add any design rules input by the designer}
    Design_Rule_List := Design_Rule_List + Input_Designer_Rules( );
    {Input the layer selected by the designer for this check}
    Designer_Selected_Layer := Input_Designer_Layer_Choice( );
    {Select design elements from the package design for a single layer, as
    specified by the designer}
    Design_Element_List:= SelectDesignElementsForChecking(Package_Design_List,
                                    Single_Layer,
                                    Designer_Selected_Layer);
    {Empty the list for storing the DRCs detected}
    Design_Rule_Check_List := EMPTY;
    {The Design_Rule_Check function tests each design element against all power
    and ground via design rules in the Design_Rule_List, returning a DCR if a
    check fails. The DRC is added to the Design_Rule_Checks_List for later
    processing.}
    Design_Rule_Checks_List := Design_Rule_Check(Design_Element_List,
    Design_Rule_List);
    IF COUNT_ITEMS_IN_LIST(Design_Rule_Checks_List) > 0 THEN
    BEGIN
        {Generate a DRC report for all detected DCRs}
        Generate_Design_Rule_Check_Report(Design_Rule_Checks_List);
        IF Design_Rule_Check_Display_Selected THEN
        BEGIN
            {If the DRCs are to be displayed on screen, the
            Generate_Design_Rule_Check_Display function sends the detected DCRs for
            output on the display}
            Generate_Design_Rule_Check_Display(Design_Rule_Checks_List);
        END IF;
    END IF;
```

In this pseudo code example, the Design_Element_List contains a list of all design elements for a single designer-selected layer. The Design_Rule_Check function steps through all design rules in the Design_Rule_List, and tests each design element in the design element list to which the rule applies. Only pseudo code for a ground via sufficiency rule is shown in the case statement for clarity in this example. The ground via sufficiency rule is a rule that counts the number of ground vias and compares the value to a minimum requirement stored in the rule definition.

```
FUNCTION Design_Rule_Check(Design_Element_List, Design_Rule_List) : DRC_List;
VARIABLES
Design_Rule_Index :        (Index variable used to step through Design_Rule_List)
Design_Element_Index :     (Index variable used to step through Design Element List)
Ground_Count :             (Count variable to count ground Vias)
DRC_List :                 (List to build the Returned DRCs)
Pad_Element_List :         (List of pads taken from Design_Element_List)
```

```
-continued
Pad_Index :                    (Variable to index the Pad_Element_List)
BEGIN
    DRC_List := EMPTY;    {Clear the return DCR list}
    {Step through the design rules in the Design Rule List and check each design element in the
      Design Element List to which the rule applies. Accumulate DRCs in the DRC_List to be
      returned at the end of the function.}
        FOR Design_Rule_Index := 1 to COUNT_ITEMS_IN_LIST(Design_Rule_List) DO
        BEGIN
            CASE Design_Rule_List[Design_Rule_Index].Type OF
            ...
            Ground_Via_Sufficiency_Rule:
            BEGIN
                {First Generate a list of all pads connected to vias in the
                 Design_Element_List}
                Pad_Element_List := GeneratePadList(Design_Element_List);
                {Then count the vias per pad}
                FOR Pad_Index := 1 TO COUNT_ITEMS_IN_LIST(Pad_Element_List)
                    DO
                BEGIN
                    Ground_Count = 0;
                    FOR Design_Element_Index := 1 to
                        COUNT_ITEMS_IN_LIST(Design_Element_List) DO
                    BEGIN
                        {Only process Via Design Elements that are on the Ground net.}
                        IF Design_Element_List[Design_Element_Index].Type = VIA
                            AND
                            Design_Element_List[Design_Element_Index].Net = GND
                            THEN
                        BEGIN
                            {Only count vias for the current pad}
                            IF Design_Element_List[Design_Element_Index].PadRef
                                = Pad_Element_List[Pad_Index].PadRef THEN
                            BEGIN
                                Ground_Count := Ground_Count + 1;
                            END IF;
                        END IF;
                    END FOR;
                    {Finished processing the Design Element for this rule, so
                     make the rule evaluation.}
                    IF Ground_Count <
                        Design_Rule_List[Design_Rule_Index].Minimum THEN
                    BEGIN
                        {The rule failed, so add the DCR to the DCR list to be
                         returned on completion of the function}
                        DRC_List := DRC_List +
                            DRC(Design_Rule_List[Design_Rule_Index].Type);
                    END IF;
                END FOR;
            END Ground_Via_Sufficiency_Rule;
            ...
            END CASE;
        END FOR;
    RETURN DRC_List; {Return the results for the Design Rule Check function}
END FUNCTION;
```

Changes may be made in the above methods and systems without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for evaluating power and ground vias in an electronic design, comprising the steps of:
    formulating one or more via sufficiency rules;
    processing the electronic design to determine whether the power and ground vias of the electronic design violate the via sufficiency rules; and
    generating an indicator associated with the electronic design to identify vias that violate the via sufficiency rules;
    wherein the via sufficiency rules define a via per pad count for one layer of the electronic design, the step of processing comprising the step of counting power and ground vias coupled with each pad of the one layer and at one or more layers of the electronic design.

2. A method of claim 1 the step of generating comprising the step of generating at least one via insufficiency design rule check for one or more violations of the via sufficiency rules when an insufficient number of power and ground vias couple with at least one pad.

3. A method of claim 2 the step of generating an indicator comprising the step of graphically depicting the design rule check on a graphical user interface illustrating the electronic design.

4. A method of claim 2 the step of generating an indicator comprising the step of textually defining the via insufficiency design rule check in a report.

5. A method of claim 4 the via per pad count being three.

6. A method of claim 1 the via per pad count being an integer greater than one.

7. A method of claim 1 the one layer being L2.

8. A method for evaluating power and ground vias in an electronic design, comprising the steps of:
- formulating one or more via sufficiency rules;
- processing the electronic design to determine whether the power and ground visa of the electronic design violate the via sufficiency rules; and
- generating an indicator associated with the electronic design to identify vias that violate the via sufficiency rules;
- wherein the via sufficiency rules specify that each layer of the electronic design should have a same number of power and ground vias, the step of processing comprising the step of determining whether each layer has the same number of power and ground vias.

9. A method of claim 8 the step of generating comprising the step of generating at least one via insufficiency DRC for one or more violations of the via sufficiency rules when at least one layer does not have the saint number of power and ground vias.

10. A method of claim 9 the step of generating an indicator comprising the step of graphically depicting the via insufficiency DRC on a graphical user interface illustrating the electronic design.

11. A method of claim 9 the step of generating an indicator comprising the step of textually defining the via insufficiency DRC in a report.

12. A software product comprising instructions, stored on computer-readable media, wherein the instructions, when executed by a computer, perform steps for determining power and ground via sufficiency in an electronic design, comprising:
- instructions for determining instances of power and ground vias within the electronic design;
- instructions for comparing the instances to one or more via sufficiency rules; and
- instructions for generating an indicator associated with the electronic design to identify violations of the via sufficiency rules;
- one of the via sufficiency rules defining that each layer of the electronic design should have a same number of power and ground vias, the instructions for comparing comprising instructions for determining whether each layer of the electronic design has the same number of power and ground vias.

13. A software product comprising instructions, stored on computer-readable media, wherein the instructions, when executed by a computer, perform steps for determining power and ground via sufficiency in an electronic design, comprising:
- instructions for determining instances of power and ground vias within the electronic design;
- instructions for comparing the instances to one or more via sufficiency rules; and
- instructions for generating an indicator associated with the electronic design to identify violations of the via sufficiency rules;
- one of the via sufficiency rules defining a power and ground via count per pad for one layer of the electronic design, the instructions for comparing comprising instructions for determining whether each layer of the electronic design has a requisite number of power and ground vias associated with each pad of the one layer.

* * * * *

UNITED STATES PATENT AND TRADEMARK OFFICE
CERTIFICATE OF CORRECTION

PATENT NO.        : 7,272,806 B2                                        Page 1 of 1
APPLICATION NO. : 10/368789
DATED             : September 18, 2007
INVENTOR(S)      : Mark D. Frank et al.

It is certified that error appears in the above-identified patent and that said Letters Patent is hereby corrected as shown below:

In column 3, line 24, delete "modem" and insert -- modern --, therefor.

In column 6, line 9, delete "110" and insert -- 101 --, therefor.

In column 12, line 55, in Claim 2, after "1" insert -- , --.

In column 12, line 61, in Claim 3, after "2" insert -- , --.

In column 12, line 65, in Claim 4, after "2" insert -- , --.

In column 13, line 1, in Claim 5, after "4" insert -- , --.

In column 13, line 2, in Claim 6, after "1" insert -- , --.

In column 13, line 4, in Claim 7, after "1" insert -- , --.

In column 13, line 9, in Claim 8, delete "visa" and insert -- vias --, therefor.

In column 13, line 19, in Claim 9, after "8" insert -- , --.

In column 13, line 22, in Claim 9, delete "saint" and insert -- same --, therefor.

In column 13, line 24, in Claim 10, after "9" insert -- , --.

In column 13, line 28, in Claim 11, after "9" insert -- , --.

Signed and Sealed this

First Day of July, 2008

JON W. DUDAS
*Director of the United States Patent and Trademark Office*